(12) United States Patent
Gao

(10) Patent No.: US 9,048,610 B2
(45) Date of Patent: *Jun. 2, 2015

(54) EXTERNAL CAVITY TUNABLE LASER WITH 25GHZ FREQUENCY INTERVAL

(71) Applicant: GP Photonics Inc., Tianjin (CN)

(72) Inventor: Peiliang Gao, Tianjin (CN)

( * ) Notice: Subject to any disclaimer, the term of this patent is extended or adjusted under 35 U.S.C. 154(b) by 34 days.

This patent is subject to a terminal disclaimer.

(21) Appl. No.: 13/974,585

(22) Filed: Aug. 23, 2013

(65) Prior Publication Data

US 2013/0343412 A1 Dec. 26, 2013

Related U.S. Application Data

(63) Continuation of application No. PCT/CN2011/075682, filed on Jun. 13, 2011.

(30) Foreign Application Priority Data

Jun. 9, 2011 (CN) .......................... 2011 1 0154436

(51) Int. Cl.

| H01S 3/10 | (2006.01) |
|---|---|
| H01S 3/00 | (2006.01) |
| H01S 3/106 | (2006.01) |
| H01S 5/14 | (2006.01) |
| H01S 3/08 | (2006.01) |
| H01S 3/081 | (2006.01) |
| H01S 3/107 | (2006.01) |

(52) U.S. Cl.
CPC ............. *H01S 3/0085* (2013.01); *H01S 3/1068* (2013.01); *H01S 5/141* (2013.01); *H01S 3/08013* (2013.01); *H01S 3/0817* (2013.01); *H01S 3/107* (2013.01); *H01S 5/143* (2013.01); *H01S 5/142* (2013.01)

(58) Field of Classification Search
CPC ..... H01S 3/1068; H01S 3/107; H01S 3/0085; H01S 3/08013; H01S 3/0817; H01S 5/141; H01S 5/142; H01S 5/143
USPC .............................................. 372/13
See application file for complete search history.

(56) References Cited

U.S. PATENT DOCUMENTS

| 8,369,367 B1* | 2/2013 | Gao | ................................ 372/13 |
| 2014/0010250 A1* | 1/2014 | Gao | ................................ 372/20 |

* cited by examiner

*Primary Examiner* — Xinning Niu
(74) *Attorney, Agent, or Firm* — Flener IP Law; Zareefa B. Flener

(57) ABSTRACT

The invention relates to an external cavity tunable laser with 25 GHz frequency interval. The laser comprise a laser cavity end mirror directly plated on a laser gain medium, and the laser gain medium, an intracavity collimating lens, an active optical phase modulator, a tunable acousto-optic filter and an intracavity total reflection mirror all arranged inside a laser cavity sequentially. The laser further comprises: an active polarization rotator arranged on the opposite side of the tunable acousto-optic filter from the intracavity total reflection mirror, a polarization beam splitter arranged behind the active polarization rotator, a first etalon, a first total reflection mirror, a second etalon, a second total reflection mirror, a drive source for the tunable acousto-optic filter, a pumping source for the laser gain medium, a drive source for the active optical phase modulator, a drive source for the active polarization rotator and a laser drive control circuit. The invention is compact with high performance, low cost for volume production and installation, achieves high spectral density, narrow spectral bandwidth and stable tunable laser output within a wide spectrum range.

12 Claims, 7 Drawing Sheets

EXTERNAL CAVITY TUNABLE LASER WITH 25GHZ FREQUENCY INTERVAL

CROSS-REFERENCE TO RELATED APPLICATION

The application is a continuation of PCT/CN2011/075682 (filed on Jun. 13, 2011), which claims priority of Chinese patent application 201110154436.2 (filed on Jun. 9, 2011), the contents of which are incorporated herein by reference, as if fully set forth herein.

FIELD OF THE INVENTION

The invention belongs to the field of photonics, and in particular relates to an external cavity tunable laser with 25 GHz frequency tuning interval.

BACKGROUND OF THE INVENTION

Currently, most of the modern communication systems are based on the fiber optical communication network, and fiber optical network has offered unprecedented huge capacity and installation flexibility and is able to support a variety of broadband applications that are under ceaseless development. Broadband and multi-channel tunable laser could help maximize the present fiber optical network resources. Data traffic can be transferred from a congested channel to an unused channel by means of dynamic provision of broadband, thus Internet requirements are met. Use of a tunable laser makes rapid establishment or change of a light path easier, and it has become one of the important sources for implementing a dynamic fiber network.

In view of these applications, an ideal tunable laser shall include the characteristics described below: wide tunable range, i.e. covering waveband C and(or) waveband L (approximately 1520 nanometers to 1620 nanometers); small size; fast handoff (sub-millisecond level) between the frequency intervals of any two international Telecommunication Unions (ITU); excellent long-term working stability (service time over 25 years); high reliability under extreme environmental conditions; low power consumption; and easy manufacturing and low cost.

With the successful development of Dense frequency Division Multiplexers (DWDM) and other high density spectrum-related sources, the modern optical system has been developed to a system with a frequency interval of 100 GHz, 50 GHz, 25 GHz and even higher density from the previous system with a frequency interval of 400 GHz and 200 GHz; meanwhile, optical communication system's transmission rate has also been developed to 10 Gbps, 40 Gbps or 100 Gbps from 2.5 Gbps in the past. This results in corresponding requirements on small-size tunable laser for the optical communication system, and in particular, higher requirement on spectrum density and spectrum width of laser output light. An external cavity tunable laser with high-sharpness etalons can achieve the aforementioned requirements and therefore suitable for the new generation dynamic optical communication system with high transmission rate and high spectrum density.

In the external cavity tunable laser, especially in such sources for optical communication, in addition to use of the high-sharpness etalons, a matched tunable narrow band optical filter is also required for compression of laser output bandwidth. If the frequency interval of laser output light is required to be $\Delta f$, the filtering bandwidth of the optical filter shall not exceed twice of this frequency interval, i.e. $<2\Delta f$, thus avoiding the laser working under a multi-mode state and further improving the operating stability of the laser; if the frequency interval of laser output light is required to be 50 GHz, the filtering bandwidth of the optical filter should be less than 100 GHz; if the frequency interval of laser output light is further required to be 25 GHz, the filtering bandwidth of the optical filter should be less than 50 GHz. An optical filter with narrower bandwidth means higher manufacturing difficulty and higher cost, such as conventional optical grating filter and acousto-optic filter. Similarly, an etalon with narrower transmission spectrum interval means larger size, higher manufacturing difficulty and higher cost.

BRIEF DESCRIPTION OF THE DRAWINGS

FIG. 3-1 is a wave vector relation diagram of the incident beam of the first diffraction, the acoustic wave field and the diffracted light beam in the acousto-optic crystal;

FIG. 3-2 is a wave vector relation diagram of the incident beam of the second diffraction, the acoustic wave field and the diffracted light beam in the acousto-optic crystal;

FIG. 9-1 shows the transmission spectrum of the first etalon with 50 GHz interval;

FIG. 9-2 shows the transmission spectrum of the second etalon with 50 GHz interval and a 25 GHz difference from the first etalon in the transmission spectrum peak frequency;

DETAILED DESCRIPTION OF THE INVENTION

Figure 1:
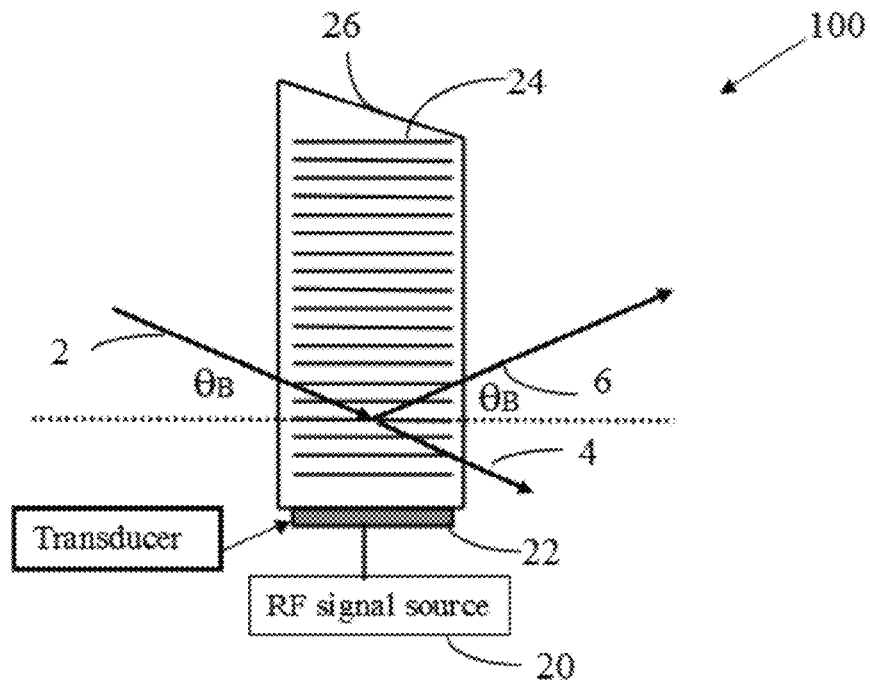
FIG. 1 is a schematic diagram of a conventional tunable acousto-optic filter.

It is an objective of the invention to overcome the shortcomings in the prior art and to provide a tunable laser with low cost, small size, easy manufacturing and high performance.

The technical scheme below is adopted by the invention for solving the technical problems in the prior art:

An external cavity tunable laser with 25 GHz frequency interval, comprising a laser cavity end mirror arranged on a laser gain medium, and the laser gain medium, an intracavity collimating lens, an active optical phase modulator for modulating the optical phase of the lasing frequency, a tunable acousto-optic filter and an intracavity total reflection mirror all arranged inside a laser cavity sequentially, the light beam emitted from the laser gain medium is collimated by the intracavity collimating lens, passes through the active optical phase modulator and enters into the tunable acousto-optic filter at approximately Bagg angle, and is diffracted into a zero order diffracted light beam and a first order diffracted light beam by the tunable acousto-optic filter, the first order diffracted light beam is reflected by the intracavity total reflection mirror back into the tunable acousto-optic filter at approximately Bragg angle, and is diffracted again into a zero order diffracted light beam and a first order diffracted light beam.

The laser further comprises:

an active polarization rotator arranged on the opposite side of the tunable acousto-optic filter from the intracavity total reflection mirror for receiving the first order diffracted light beam of the second diffraction by the tunable acousto-optic filter and controlling the polarization direction of linearly polarized incident light;

a polarization beam splitter arranged behind the active polarization rotator for total transmission of the parallel polarized incident light and reflecting the vertically polarized incident light into a direction having an angle of 90 degrees with respect to the incident light;

a first etalon and a first total reflection mirror, which are arranged in a direction vertical to the optic axis of the first order diffracted light beam of the second diffraction by the tunable acousto-optic filter and used for receiving the vertically polarized light output by the polarization beam splitter and outputting the vertically polarized light to the first total reflection mirror, the first total reflection mirror and the laser cavity end mirror forming a first laser resonant sub-cavity;

a second etalon and a second total reflection mirror, which are arranged in the same direction as the optic axis of the first order diffracted light beam of the second diffraction by the tunable acousto-optic filter and used for receiving the parallel polarized light output by the polarization beam splitter and outputting the parallel polarized light to the second total reflection mirror, the second total reflection mirror and the laser cavity end mirror forming a second laser resonant sub-cavity;

a radio frequency signal source used for providing radio frequency energy for the tunable acousto-optic filter and adjusting the oscillation frequency of the first and second laser resonant sub-cavity by changing RF frequency;

a laser pumping source, a drive source for the active optical phase modulator, a drive source for the active polarization rotator and a laser drive control circuit.

Further, the first etalon and the second etalon have the same finesse.

Further, the first etalon and the second etalon have the same spectrum range as the laser gain medium, both the first etalon and the second etalon have a transmission spectrum peak interval of 50 GHz with 25 GHz difference in transmission peak frequency.

Further, the first total reflection mirror, the second total reflection mirror and the intracavity total reflection mirror having the same spectrum range as the laser gain medium are one of the following types of reflection mirrors: plane mirror, convex mirror and concave mirror.

Further, the laser cavity end mirror is a total reflection mirror or a partial reflection mirror within a specified spectrum range, and has the same spectrum range as the laser gain medium.

Further, the tunable acousto-optic filter comprises a single acousto-optic crystal and a single acoustic wave transducer.

Further, the tunable acousto-optic filter is a narrow band optical filter and has the same spectrum range as the laser gain medium, and the FWHM of the tunable acousto-optic filter is not more than twice the transmission spectrum peak frequency of the first etalon or the second etalon.

Further, the active optical phase modulator is one of the following types: electro-optic phase modulator, or magneto-optic phase modulator, or liquid crystal phase modulator, or acousto-optic phase modulator, or phase modulators based on other forms of physical optical effect, or a combination of the aforementioned phase modulators, and has the same spectrum range as the laser gain medium.

Further, the active polarization rotator is one of the following types: electro-optic active polarization rotator, or magneto-optic active polarization rotator, or liquid crystal active polarization rotator, or acousto-optic active polarization rotator, or active polarization rotators based on other forms of physical optical effect, or a combination of the aforementioned active polarization rotators, and has the same spectrum range as the laser gain medium.

Further, the laser drive control circuit comprises: a digital signal processor and four digital-to-analog conversion modules, the digital signal processor is used for receiving an external instructions signal and to control the laser pumping source, the radio frequency signal source, the drive source for the active optical phase modulator and the drive source for the active polarization rotator.

The invention has the following advantages and positive effects:

By forming two laser resonant sub-cavities with the active polarization rotator and the polarization beam splitter, the tunable stable laser in the invention is capable of tuning the optical frequency of the laser output by 25 GHz frequency interval within a wide spectrum range using two etalons having a transmission spectrum peak interval of 50 GHz, and the tunable acousto-optic filter suitable for 50 GHz frequency interval tuning. Therefore, the requirements on the transmission spectrum peak interval and on the filtering bandwidth of the tunable acousto-optic filter are reduced. Thus the difficulty in manufacturing the tunable acousto-optic filter and the etalons are significantly reduced.

The tunable laser is compact with high performance, low cost for volume production and easy installation, achieves high spectral density, narrow spectral bandwidth and stable tunable laser output within a wide spectrum range, and can meet the requirements of fiber optical communication for small size and reliable operation in an extreme working environment. Furthermore, the invention can also be widely used in biology, medical instrument, fiber optical sensor network and other fields.

Further detailed description is made below to the embodiments of the invention with reference to the drawings.

FIG. 1 illustrates a conventional tunable acousto-optic filter 100. The tunable acousto-optic filter 100 comprises a transducer 22, a radio frequency signal source 20 and an acousto-optic crystal 26, the transducer 20 is bonded to the acousto-optic crystal. An incident light beam 2 enters the acousto-optic crystal 26 at Bragg angle to generate a zero-order diffraction light beam 4 and a first-order diffraction light beam 6.

Figures 1, 3:
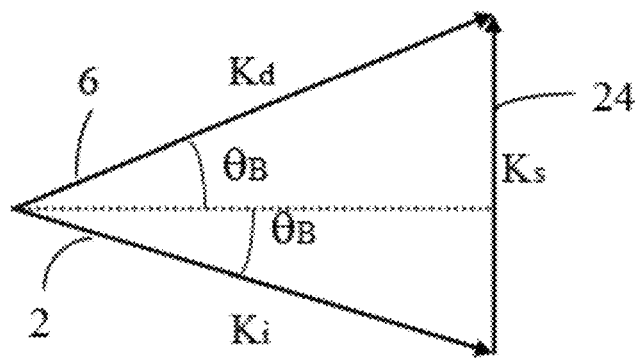
Figures 2, 3:
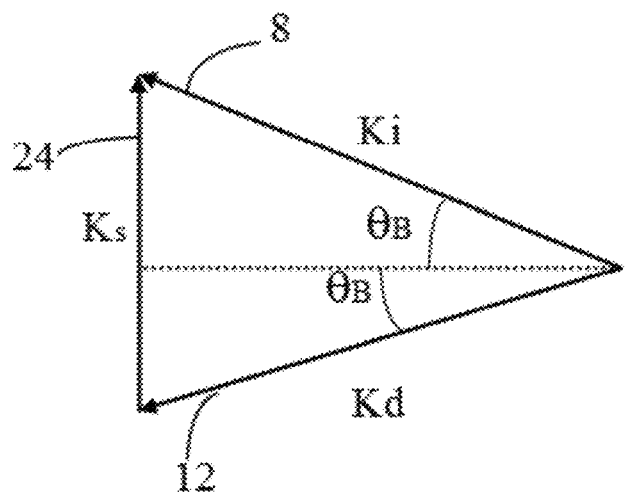

The principle of the acousto-optic filter is based upon a phenomenon known as Bragg diffraction that involves the interaction process of photons (light energy's quanta) and phonons (acoustic energy's quanta). Both energy and momentum are conserved in this interaction process. $\hbar\kappa_d = \hbar\kappa_i + \hbar\kappa_s$ is required in momentum conservation, wherein $\hbar\kappa_d$ is the momentum of diffraction photon, $\hbar\kappa_i$ is the momentum of incident photon and $\hbar\kappa_s$ is the momentum of interactive phonon. The formula below is obtained after $\hbar$ is removed: $\kappa_d = \kappa_i + \kappa_s$, which is the fundamental wave vector equation in Bragg diffraction and means that diffracted light wave vector is the vector sum of the incident light wave vector and the acoustic wave vector, as shown in FIG. 3-1. The relation of $(\hbar\omega_r = \hbar\omega + \hbar\Omega)$ is required in energy conservation, wherein $\omega_r$ is the angular frequency of diffraction light, $\omega$ is the angular frequency of incident light and $\Omega$ is the angular frequency of acoustic wave. The formula below is obtained after $\hbar$ is removed: $\omega_r=\omega+\Omega$. This means that the angular frequency of diffraction photon is slightly altered by the angular frequency of acoustic wave, or so called Doppler frequency shift. Acousto-optic Tunable Filter (AOTF) 100 is a solid-state bandpass optical filter that can be tuned by electric signal. Compared with the traditional techniques, AOTF provides continuous and fast tuning capability with narrow spectrum bandwidth. Acousto-optic filters can be divided in two categories: collinear and non-collinear. Narrow-band filtering can be realized by a non-collinear and far off-axis type filter. From the formula $\omega_r=\omega+\Omega$, it is known that the magnitude of the frequency shift of light wave is equal to the frequency of acoustic wave.

While Doppler frequency shift in AOTF is small because acoustic wave frequency is of many orders of magnitude smaller compared with the light wave frequency, unstable operation can still arise in some laser systems. A solution to this problem is the use of two AOTFs in which the second AOTF is used for offsetting the frequency shift caused by the first AOTF. Another solution is the use of two transducers on a single acousto-optic crystal. But these solutions have a few shortcomings such as: 1), the increase of system size and electric power consumption, 2), more difficult for optical alignment, 3), unstable operation, and 4), cost increase, which is especially important for mass production.

Figure 2:
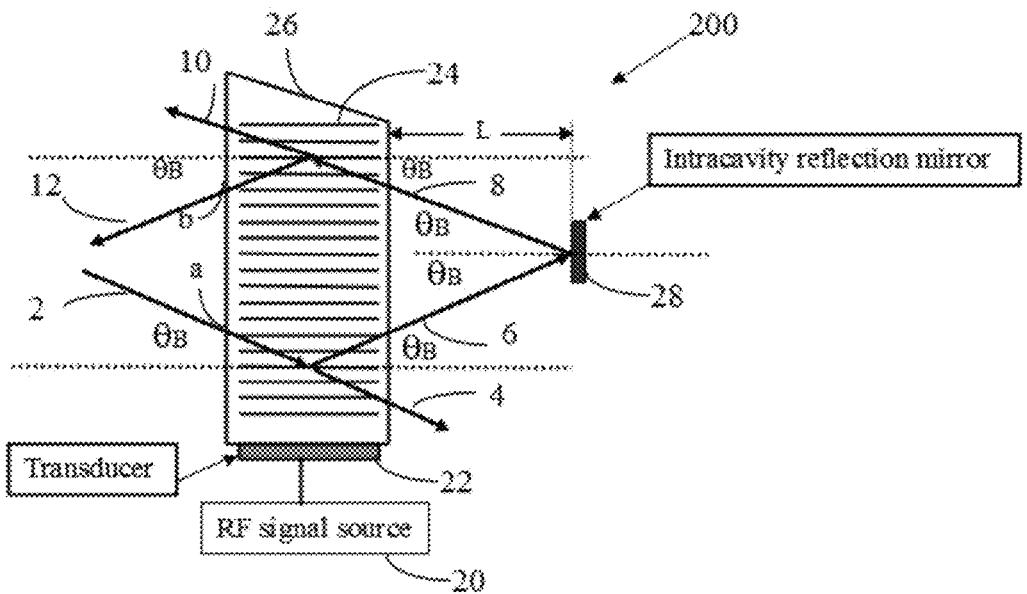
FIG. 2 is a schematic diagram of an existing tunable acousto-optic filter with frequency shift compensation.

FIG. 2 illustrates a tunable acousto-optic filter 200 capable of eliminating frequency shift effectively. The tunable acousto-optic filter 200 comprises a transducer 22, an acousto-optic crystal 26, a radio frequency signal source 20 and a total reflection mirror 28, an incident light beam 2 enters the acousto-optic crystal 26 at Bragg angle to generate a zero-order diffracted light beam 4 and a first-order diffracted light beam 6, which is diffracted again by acousto-optic crystal 26 into a zero-order diffracted light beam 10 and a first-order diffracted light beam 12 after being reflected by the total reflection mirror 28. FIG. 3-1 and FIG. 3-2 illustrate the wave vector relation among incident light ($\kappa_i$), diffraction light ($\kappa_d$) and acoustic wave ($\omega_s$). As mentioned above, the relation $\kappa_i \pm \kappa_s = \kappa_d$ is always true, whether plus sign (+) or minus sign (−) is used is determined by the direction of incident acoustic wave with respect to that of the acoustic waves. In FIG. 3-1, light 2 ($\kappa_2$), light 6 ($\kappa_s$) and acoustic wave 24 ($\kappa_s$) have such a relation that: $\kappa_2+\kappa_s=\kappa_4$. The acoustic wave $K_s$ leads to not only upward shift of the diffracted light, but also upward shift of the angular frequency $\omega$ of the light by $\Omega=v_s|\kappa_s|$, wherein $v_s$ is the velocity of acoustic wave. In FIG. 3-2, light 8 ($\kappa_8$), light 12 ($\kappa_{12}$) and acoustic wave 24 ($K_s$) have such a relation that: $\kappa_5-\kappa_5=\kappa_{12}$. In this case, acoustic wave leads to downward shift and also downward shift of the angular frequency $\omega$ of the light 12 diffracted by $v_s|\kappa_s|$. The upward and downward shifts are basically the same, so the overall frequency shift is fully eliminated when the light 12 exits from the acousto-optic filter 200.

In some embodiments, for example, when narrow-band tuning is needed, an anisotropic and birefringent acousto-optic crystal is used. One of the crystals is tellurium dioxide ($TeO_2$), which is widely used in such applications because it has high optical uniformity, low light absorbance and high damage threshold to optical power when operating under a shear mode. Other crystals such as lithium niobate ($LiNbO_3$), gallium phosphide (GaP) and lead molybdate ($PbMoO_4$) are also frequently used in a variety of acousto-optic sources. There are several factors that influence the choice of a particular crystal such as the type of acousto-optic source, whether high-quality crystal is easily available and the requirements of a particular application, such as diffraction efficiency, power loss, degree of dispersion of the incident light and the diffracted light and overall source size, etc.

Figure 4:
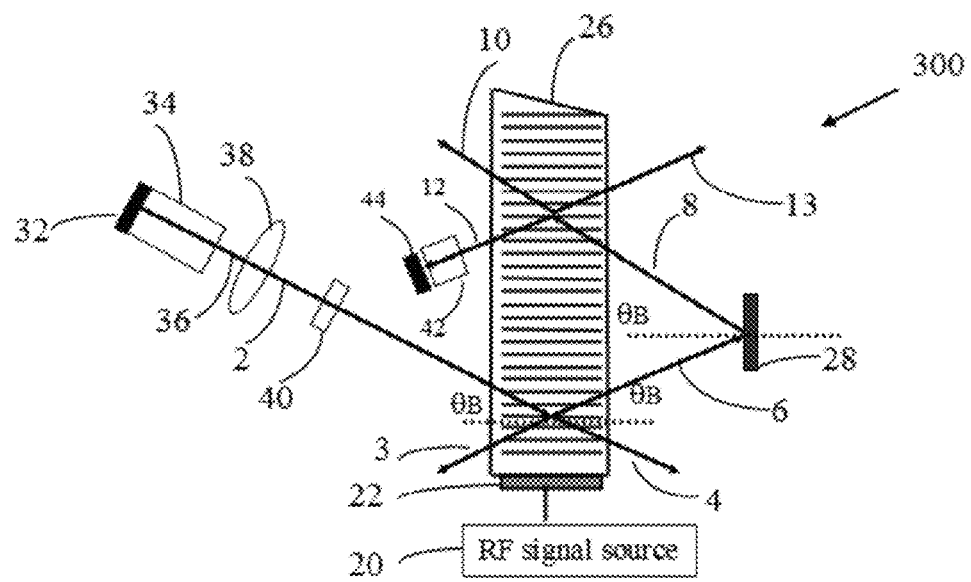
FIG. 4 is a schematic diagram of an external cavity tunable laser using a tunable acousto-optic filter and a single etalon.

FIG. 4 illustrates an external cavity tunable laser 300 using a tunable acousto-optic filter as shown in FIG. 2 and a single etalon. The tunable laser 300 comprises a laser cavity end mirror 32 directly plated on a laser gain medium 34, the laser gain medium 34, an intracavity collimating lens 36, an active optical phase modulator 40, a tunable acousto-optic filter 100, an intracavity total reflection mirror 28, an etalon 42 and a total reflection mirror 44, wherein the laser cavity end mirror 32 and the total reflection mirror 44 form a laser resonant cavity.

Laser output mirror differs in reflectivity for light with different frequencies or colors, and the reflectivity mentioned herein means a reflectivity corresponding to the frequency bandwidth of an operating laser. The laser cavity end mirror 32 can be either a partial reflection mirror or a total reflection mirror according to different situations. When the laser gain medium is a semiconductor gain medium that has a relatively large output divergent angle, the intracavity collimating lens of the tunable laser 300 is normally used. When the laser gain medium is gas, liquid or some solid media, the intracavity collimating lens is not often used, instead, a non-planar cavity mirror is used to realize a reasonable distribution of intracavity light beams. When such lasers are used for fiber optical communication, an output light beam 4 needs to be coupled to an optical fiber, so the collimating lens 38 is indispensable.

In the tunable laser 300, a wideband light beam 36 emitted from the laser gain medium 34 is collimated by the intracavity collimating lens 38 to form a light beam 2, the light beam 2 enters the acousto-optic crystal 26 at Bragg angle in the opposite direction of the acoustic waves inside the acousto-optic crystal 26 through the active optical phase modulator 40, a first-order diffracted light beam 6 enters the intracavity total reflection mirror 28 at Bragg angle which has an optical reflection surface aligned parallel to the propagation direction of the acoustic wave inside the acousto-optic crystal 26, and the reflected light beam 8 by the total reflection mirror 28 enters the acousto-optic crystal 26 at Bragg angle. A first-order diffracted light beam 12 of the second diffraction by the acousto-optic crystal 26 passes through the etalon 42 and is then reflected back into a laser cavity by the total reflection mirror 44, thus creating laser oscillation and amplification inside the laser cavity. During this process, light beams 4 and 10 are the zero-order diffracted light beams of the light beams 2 and 8 respectively inside the laser cavity; a light beam 13 is the zero-order diffracted light beam of the light beam 12, which leaks out of the laser cavity and becomes the loss of the laser cavity. The light beam 4 is selected as a laser output light beam due to its higher power compared with other light beams and zero optical frequency shift. Light beams 10 and 13 can be used for monitoring the optical power and frequency inside the laser cavity.

As previously analyzed, optical frequency shifts generated by the first diffraction and the second diffraction are equal, but opposite to each other, so the overall optical frequency shift caused by the tunable acousto-optic filter 100 inside tunable laser 300 is zero. Laser oscillation bandwidth that is narrower than first diffraction is formed in the laser cavity due to the second diffraction by the tunable acousto-optic filter 100.

Laser output tuning is achieved by the active optical phase modulator 40 and the tunable acousto-optic filter 100. The light wave resonant frequency in the laser cavity can be changed by changing the RF frequency of the radio frequency signal source 20 for the tunable acousto-optic filter 100. In accordance with different light wave resonant frequencies, the active optical phase modulator 40 enables a particular light wave to form laser oscillation and amplification in the laser cavity by regulating the phase of the light wave to meet the lasing oscillation conditions in the laser cavity.

The interval and bandwidth of laser output spectrum are determined by the etalon 42. The use of an etalon with a high finesse can compress the spectrum bandwidth of output light beam and increase the side mode suppression ratio. If the interval of laser output spectrum needs to be reduced, both the filtering bandwidth of the tunable acousto-optic filter 100 and the interval of the transmission spectrum peak frequencies of the etalon 42 need to be reduced at the same time in order to establish a stable lasing operation inside laser cavity. In this way, the phenomenon of laser cavity mode hopping is avoided and single-mode oscillation of the laser is guaranteed. If the interval of laser output spectrum needs to be 25 GHz, the spectrum interval of the etalon 42 needs to be 25 GHz, and it is also required that the FWHM (Full Width Half Maximum) of the filtering bandwidth of the tunable acousto-optic filter 100 is at least less than 50 GHz. This significantly increases the technical difficulty and manufacturing cost of the tunable acousto-optic filter 100. The technical difficulty and manufacturing cost of the etalon are also increased. In the case that the laser gain medium is a homogeneous gain medium, it is generally required that the FWHM of the filtering bandwidth of the tunable acousto-optic filter is less than $2\Delta f$ (assuming that the transmission bandwidth of the etalon is $\Delta f$). If the filtering bandwidth of the tunable acousto-optic filter is more than $2\Delta f$, multi-mode oscillation may occur to result in multi-mode output or mode hopping. If the laser gain medium is a non-homogeneous gain medium, it is required that the FWHM of the filtering bandwidth of the tunable acousto-optic filter should be even narrower.

Figure 5:
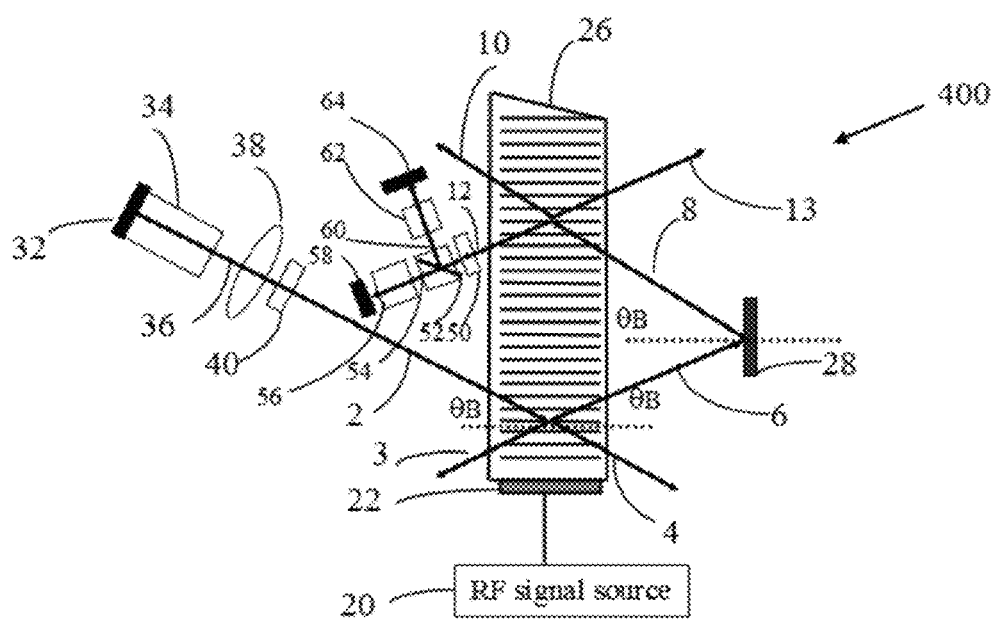
FIG. 5 is a schematic diagram of the invention.

Detailed description is made below to an external cavity tunable laser 400 of the invention:

A method for solving the aforementioned problems is described, in which two etalons are used and arranged in two laser sub-cavities in the external cavity tunable laser 400. As shown in FIG. 5, the external cavity tunable laser 400 comprises a laser cavity end mirror 32 directly plated on a laser gain medium 34, the laser gain medium 34, an intracavity collimating lens 38, an active optical phase modulator 40, a tunable acousto-optic filter 100, an intracavity total reflection mirror 28, an active polarization rotator 50, a polarization beam splitter 52, a first etalon 62, a first total reflection mirror 64, a second etalon 56, a second total reflection mirror 58 and a laser drive control circuit.

Figure 6:
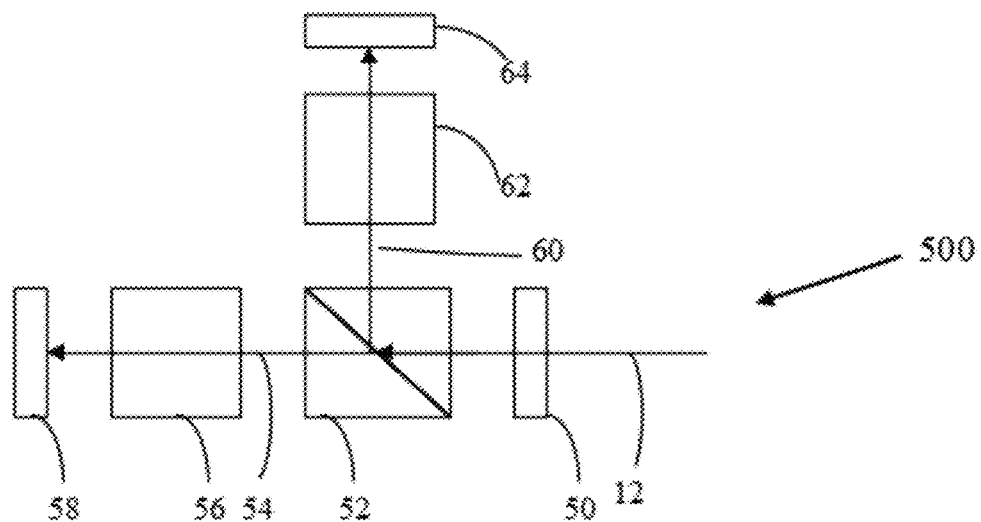
FIG. 6 is a schematic diagram for laser resonant mode switching by an active polarization rotator and a polarization beam splitter.
Figure 7:
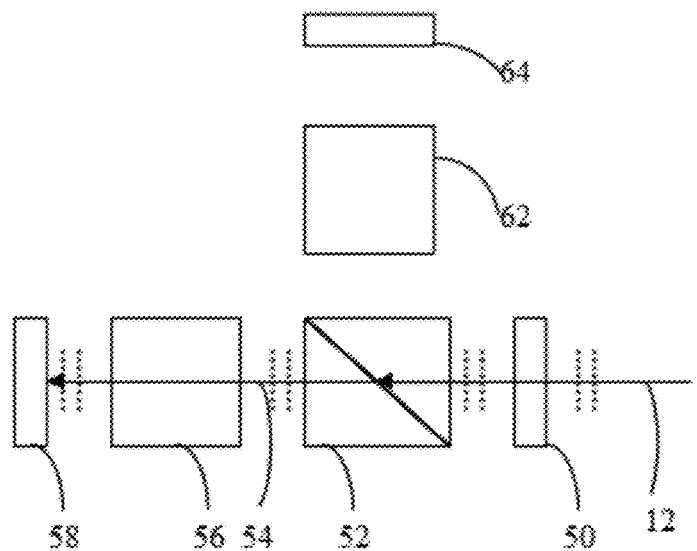
FIG. 7 is a schematic diagram illustrating the transmission path of the parallel polarized light depicted in FIG. 6.
Figure 8:
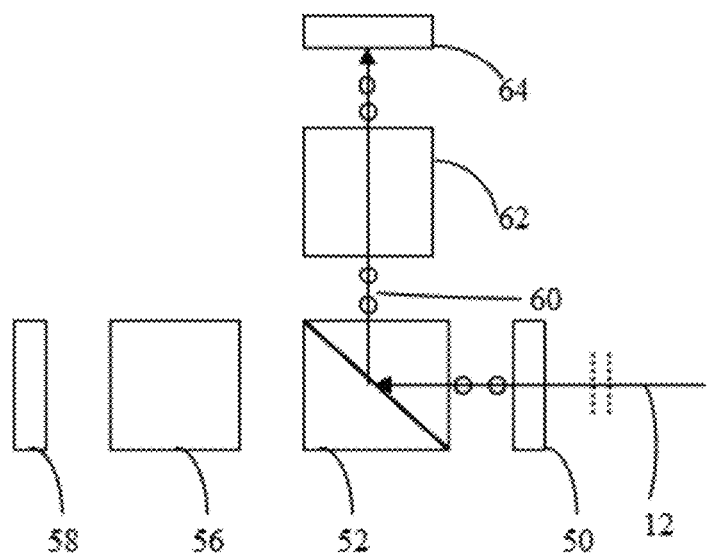
FIG. 8 is a schematic diagram illustrating the transmission path of vertically polarized light depicted in FIG. 6.
Figures 1, 9:
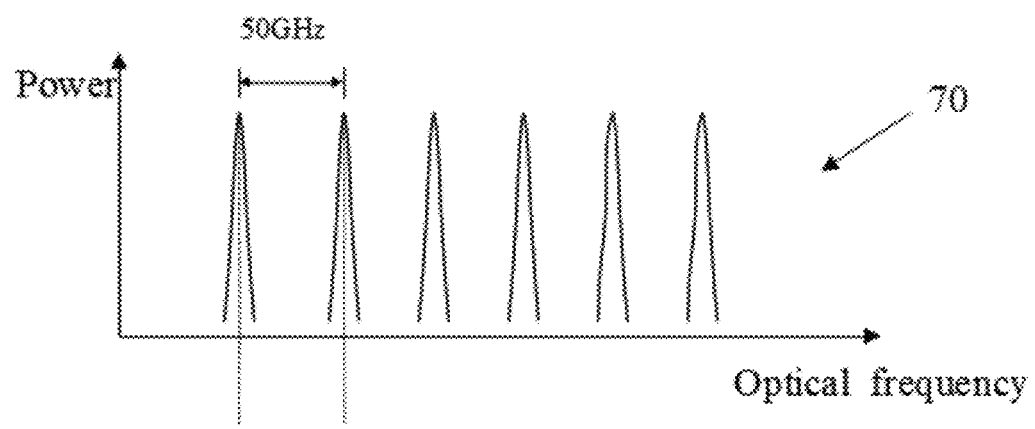
Figures 2, 9:
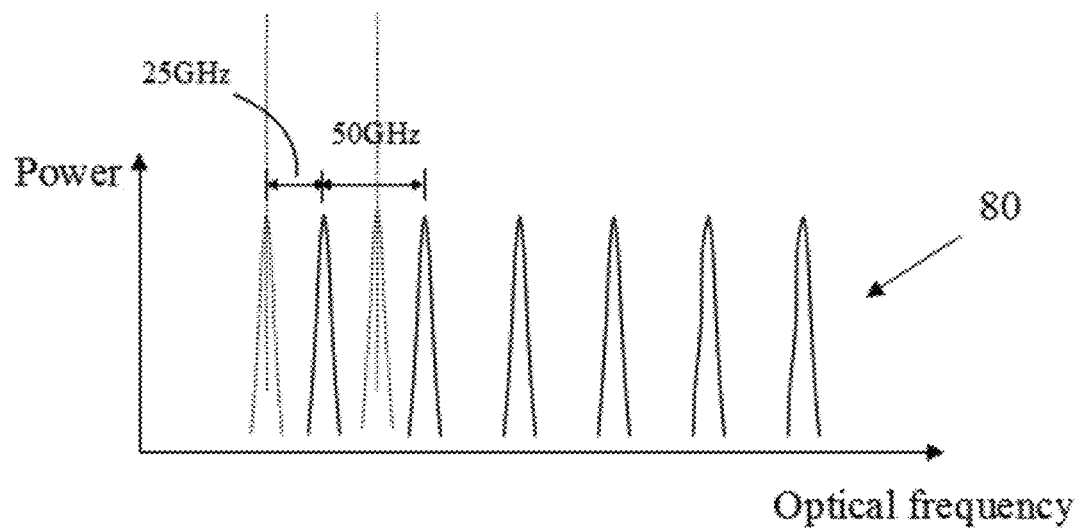
Figure 10:
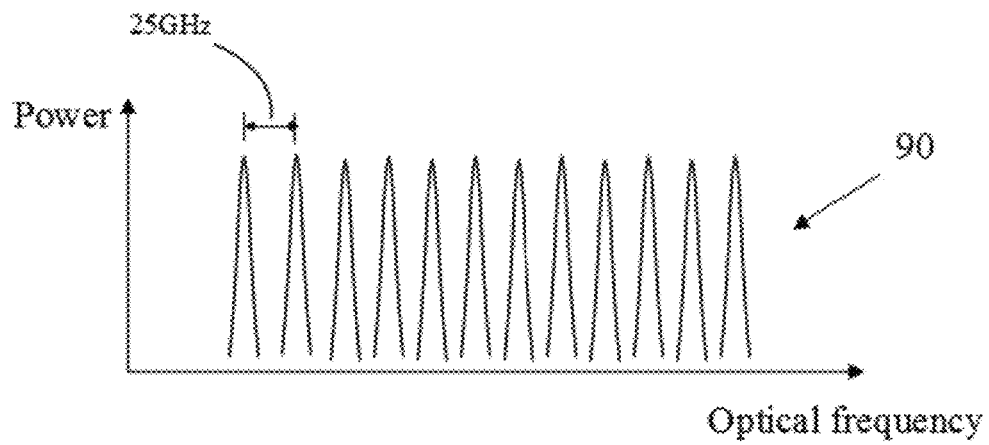
FIG. 10 is a schematic diagram of the output spectrum of the tunable laser with 25 GHz transmission spectrum interval.

The active polarization rotator 50 is arranged behind the tunable acousto-optic filter 100 for rotating the polarization direction of linearly polarized incident light 12 by 90 degrees, the polarization beam splitter 52 is arranged behind the active polarization rotator 50 for total transmission of parallel polarized incident light and for reflecting vertically polarized incident light into a direction having an angle of 90 degrees with respect to the incident light; the first etalon 62 is arranged in a direction vertical to the light 12 inside the laser cavity and is used for receiving the vertically polarized light 60 output by the polarization beam splitter 52 and outputting the vertically polarized light to the first total reflection mirror 64. The first total reflection mirror 64 and the laser cavity end mirror 32 form the first laser resonant sub-cavity. The second etalon 56 is arranged in the direction of the light 12 inside the laser cavity and used for receiving the parallel polarized light output by the polarization beam splitter 52 and outputting the parallel polarized light to the second total reflection mirror 58. The second total reflection mirror 58 and the laser cavity end mirror 32 form the second laser resonant sub-cavity. The difference of the tunable laser 400 from the tunable laser 300 is that: the etalon 34 and the total reflection mirror 36 in the tunable laser 300 (FIG. 4) are replaced by a dual-light path system 500 comprising the active polarization rotator 60, the polarization beam splitter 52, the first etalon 62, the first total reflection mirror 64, the second etalon 56 and the second total reflection mirror 58, as shown in FIG. 6. The active polarization rotator 50 is used to change the polarization direction of the incident light 12. When the active polarization rotator does not work, the incident light 12 directly passes through the polarization beam splitter 52, then arrives at the second total reflection mirror 58 through the second etalon 56, and is finally reflected back into the second laser resonant sub-cavity through the second total reflection mirror 58, as shown in FIG. 7. When the active polarization rotator is activated, the incident light 12 is turned into vertically polarized light after the polarization state is rotated by 90 degrees, the vertically polarized light is reflected by the polarization beam splitter 54, then arrives at the second total reflection mirror 64 through the first etalon 62 and is finally reflected back into the first laser resonant sub-cavity through the second total reflection mirror 64, as shown in FIG. 8. The light reflected back by the second total reflection mirror 64 passes through the active polarization rotator 50 once again and the polarization state is rotated by 90 degrees once again, as a result, the polarization direction of the output light beam of the laser is not changed. Therefore, two laser resonant sub-cavities in the tunable laser 400 can be formed as shown in FIG. 5 by controlling the active polarization rotator 50. FIG. 9-1 and FIG. 9-2 illustrate the transmission spectra of the first etalon 62 and the second etalon 56 respectively. The etalon 56 and 62 have the same transmission spectrum interval of 50 GHz and the same finesse, but there is a difference of 25 GHz between their transmission spectrum peaks. In this manner, the output spectrum of the tunable laser 400 is an integration of the two laser sub-cavities, which means that tunable laser output with 25 GHz spectrum peak interval and consistent polarization states can be realized, as shown in FIG. 10.

In the invention, the first etalon 62 and the second etalon 56 have the same finesse, and same the spectrum range as the laser gain medium. Furthermore, both the first etalon 62 and the second etalon 56 have a transmission spectrum peak interval of 50 GHz, but have a 25 GHz difference between the transmission spectrum peak frequency. For the tunable lasers used in fiber optical communication, the transmission spectrum peak of the first etalon 62 and the second etalon 56 should meet international telecommunication standards (ITU-GRID). As for other applications, the transmission spectrum peak of the first etalon 62 and the second etalon 56 can be different based upon a specific application design.

With the structure of the tunable laser 400, stable tunable output with smaller spectrum frequency interval than 25 GHz can be realized when the FWHM value of the filtering bandwidth of the tunable acousto-optic filter is less than $2\Delta f$ (assuming that the transmission bandwidth of the etalon is $\Delta f$). For example, the transmission spectrum peak intervals of the first etalon 62 and the second etalon 56 may be 25 GHz. When such a condition is satisfied that there is a difference of 12.5 GHz between the transmission spectrum peak frequency of the second etalon 56 and the transmission spectrum peak frequency of the first etalon 62, the tunable laser 400 can realize stable tunable output with 12.5 GHz spectrum frequency interval if the FWHM of the filtering bandwidth of the tunable acousto-optic filter is less than 25 GHz.

In general, fluorescent light output by a semiconductor laser gain medium is linearly polarized light. For such laser gain media, a polarizer is not needed in the cavity. As for other laser gain media that output is nonlinearly polarized light, a polarizer is indispensable for the tunable laser 400 to achieve the described functions.

With the development of fiber optical communication technology, DWDM optical communication network has been developed towards 25 GHz and even higher optical channel density. This requires a tunable acousto-optic filter with even narrower filtering bandwidth, which further increases the difficulty in manufacturing such a tunable acousto-optic filter and a small-sized tunable laser, and the cost will become higher. Hence, the tunable laser 400, on the basis of the existing external cavity laser with 50 GHz frequency interval, can provide a novel method capable of achieving tunable output with 25 GHz frequency interval or even smaller spectrum interval while the cost and manufacturing difficulty are not increased significantly.

Figure 11:
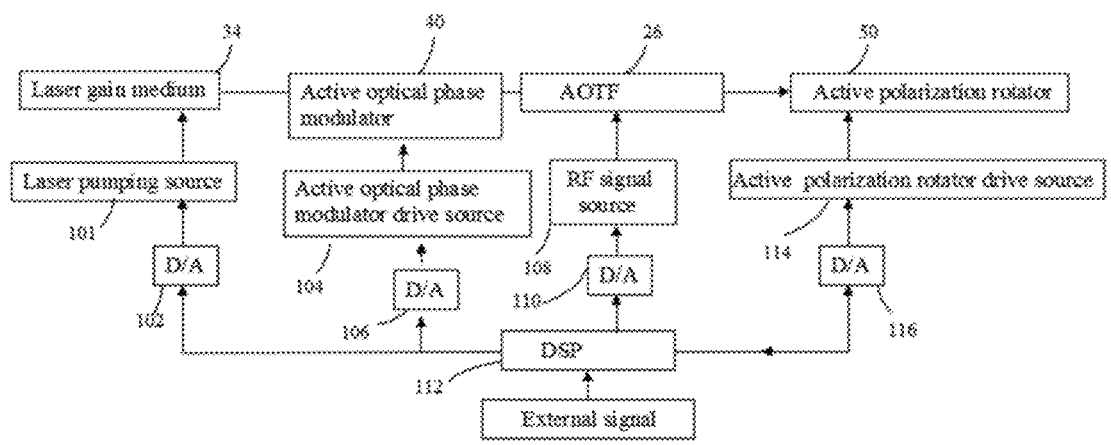
FIG. 11 is a functional block diagram of the laser drive control circuit of the invention.

FIG. 11 shows the laser drive control circuit for tunable laser 400. The laser drive control circuit comprises a digital signal processor (DSP) 112 with embedded software programs, four digital-to-analog conversion (D/A) sources 102, 106, 110 and 116. The digital signal processor (DSP) 112 with embedded software programs is used for controlling the laser pumping source 101, the active optical phase modulator drive source 104, the radio frequency signal source 108 and the active polarization rotator drive source 114 respectively through the digital-to-analog conversion (D/A) sources 102, 106, 110 and 116. The digital signal processor 112 may also receive an external instruction to control the tunable laser 400.

The above description is for demonstration and description only, not a detailed one without omission, and is not intended to limit the invention within the described specific forms. With the aforementioned description, many modifications and variations to the invention are possible. The chosen embodiments are merely for better explanation of the principle and practical applications of the invention. This description enables people familiar with this art to make better use of the invention, and to design different embodiments based on the actual needs and implement corresponding modifications.

What is claimed is:

1. An external cavity tunable laser with 25 GHz frequency interval, comprising a laser cavity end mirror arranged on a laser gain medium, and the laser gain medium, an intracavity collimating lens, an active optical phase modulator for modulating the optical phase of the lasing frequency, a tunable acousto-optic filter and an intracavity total reflection mirror all arranged inside a laser cavity sequentially, the light beam emitted from the laser gain medium is collimated by the intracavity collimating lens, passes through the active optical phase modulator and enters into the tunable acousto-optic filter at Bragg angle, and is diffracted into a zero order diffracted light beam and a first order diffracted light beam by the tunable acousto-optic filter, the first order diffracted light beam is reflected by the intracavity total reflection mirror back into the tunable acousto-optic filter at Bragg angle, and is diffracted again into a zero order diffracted light beam and a first order diffracted light beam, the laser wherein: an active polarization rotator arranged on the opposite side of the tunable acousto-optic filter from the intracavity total reflection mirror for receiving the first order diffracted light beam of the second diffraction by the tunable acousto-optic filter and controlling the polarization direction of linearly polarized incident light; a polarization beam splitter arranged behind the active polarization rotator for total transmission of the parallel polarized incident light and reflecting the vertically polarized incident light into a direction having an angle of 90 degrees with respect to the incident light; a first etalon and a first total reflection mirror, which are arranged in a direction vertical to the optic axis of the first order diffracted light beam of the second diffraction by the tunable acousto-optic filter and used for receiving the vertically polarized light output by the polarization beam splitter and outputting the vertically polarized light to the first total reflection mirror, the first total reflection mirror and the laser cavity end mirror forming a first laser resonant sub-cavity; a second etalon and a second total reflection mirror, which are arranged in the same direction as the optic axis of the first order diffracted light beam of the second diffraction by the tunable acousto-optic filter and used for receiving the parallel polarized light output by the polarization beam splitter and outputting the parallel polarized light to the second total reflection mirror, the second total reflection mirror and the laser cavity end mirror forming a second laser resonant sub-cavity; a radio frequency signal source used for providing radio frequency energy for the tunable acousto-optic filter and adjusting the oscillation frequency of the first and second laser resonant sub-cavity by changing RE frequency; and a laser pumping source, a drive source for the active optical phase modulator, a drive source for the active polarization rotator and a laser drive control circuit.

2. The external cavity tunable laser with 25 GHz frequency interval of claim 1, wherein the first etalon and the second etalon have the same finesse.

3. The external cavity tunable laser with 25 GHz frequency interval of claim 2, wherein the first etalon and the second etalon have the same spectrum range as the laser gain medium, both the first etalon and the second etalon have a transmission spectrum peak interval of 50 GHz with 25 GHz difference in transmission peak frequency.

4. The external cavity tunable laser with 25 GHz frequency interval of claim 1 wherein the first etalon and the second etalon have the same spectrum range as the laser gain medium, both the first etalon and the second etalon have a transmission spectrum peak interval of 50 GHz with 25 GHz difference in transmission peak frequency.

5. The external cavity tunable laser with 25 GHz frequency interval of claim 1, wherein the first total reflection mirror, the second total reflection mirror and the intracavity total reflection mirror having the same spectrum range as the laser gain medium are one of the following types of reflection mirrors: plane mirror, convex mirror and concave mirror.

6. The external cavity tunable laser with 25 GHz frequency interval of claim 1, wherein the laser cavity end mirror is a total reflection mirror or a partial reflection mirror within a specified spectrum range, and has the same spectrum range as the laser gain medium.

7. The external cavity tunable laser with 25 GHz frequency interval of claim 1, wherein the tunable acousto-optic filter comprises a single acousto-optic crystal and a single acoustic wave transducer.

8. The external cavity tunable laser with 25 GHz frequency interval of claim 7, wherein the tunable acousto-optic filter is a narrow band optical filter and has the same spectrum range as the laser gain medium, and the FWHM of the tunable acousto-optic filter is not more than twice the transmission spectrum peak frequency of the first etalon or the second etalon.

9. The external cavity tunable laser with 25 GHz frequency interval of claim 1, wherein the tunable acousto-optic filter is a narrow band optical filter and has the same spectrum range as the laser gain medium, and the FWHM of the tunable acousto-optic filter is not more than twice the transmission spectrum peak frequency of the first etalon or the second etalon.

10. The external cavity tunable laser with 25 GHz frequency interval of claim 1, wherein the active optical phase modulator is one of the following types: electro-optic phase modulator, or magneto-optic phase modulator, or liquid crystal phase modulator, or acousto-optic phase modulator, or phase modulators based on other forms of physical optical effect, or a combination of the aforementioned phase modulators, and has the same spectrum range as the laser gain medium.

11. The external cavity tunable laser with 25 GHz frequency interval of claim 1, wherein the active polarization rotator is one of the following types: electro-optic active polarization rotator, or magneto-optic active polarization rotator, or liquid crystal active polarization rotator, or acousto-optic active polarization rotator, or active polarization rotators based on other forms of physical optical effect, or a combination of the aforementioned active polarization rotators, and has the same spectrum range as the laser gain medium.

12. The external cavity tunable laser with 25 GHz frequency interval of claim 1, wherein the laser drive control circuit comprising: a digital signal processor and four digital-to-analog conversion modules, the digital signal processor is used for receiving an external instructions signal and to control the laser pumping source, the radio frequency signal source, the drive source for the active optical phase modulator and the drive source for the active polarization rotator.

* * * * *